(12) United States Patent
Park et al.

(10) Patent No.: US 10,754,391 B2
(45) Date of Patent: Aug. 25, 2020

(54) AXIAL CAM HINGE

(71) Applicant: Microsoft Technology Licensing, LLC, Redmond, WA (US)

(72) Inventors: Daniel C. Park, Woodinville, WA (US); Karsten Aagaard, Monroe, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/231,606

(22) Filed: Aug. 8, 2016

(65) Prior Publication Data

US 2018/0042129 A1 Feb. 8, 2018

(51) Int. Cl.
*G06F 1/16* (2006.01)
*F16M 11/10* (2006.01)
(Continued)

(52) U.S. Cl.
CPC .............. *G06F 1/1681* (2013.01); *E05D 3/12* (2013.01); *E05D 5/10* (2013.01); *E05D 11/0081* (2013.01); *E05D 11/082* (2013.01); *F16M 11/10* (2013.01); *F16M 11/2021* (2013.01); *G06F 1/1679* (2013.01); *G06F 1/1683* (2013.01); *H05K 5/0017* (2013.01); *H05K 5/0217* (2013.01);
(Continued)

(58) Field of Classification Search
CPC .... G06F 1/1615; G06F 1/1681; G06F 1/1683; F16M 11/10; F16M 11/18; H05K 5/0226; H05K 5/0234
See application file for complete search history.

(56) References Cited

U.S. PATENT DOCUMENTS 3,955,241 A 5/1976 Little
4,246,802 A 1/1981 Rasmussen et al.
(Continued)

FOREIGN PATENT DOCUMENTS

CN 1346926 A 5/2002
CN 1520251 A 8/2004
(Continued)

OTHER PUBLICATIONS

Korane, Kenneth, "Options for designing the best hinge", retrieved at <<http://machinedesign.com/news/options-designing-best-hinge>>, Jul. 19, 2012, 4 pages.
(Continued)

*Primary Examiner* — Nidhi Thaker
(74) *Attorney, Agent, or Firm* — Rainier Patents, P.S.

(57) ABSTRACT

The description relates to devices that include hinged portions and controlling rotation of the portions. One example can include a display coupled to a first end of an arm. The example can also include a base rotatably secured to a hollow shaft that is fixed to the arm. The hollow shaft defines an axis of rotation of the arm relative to the base. The base can also include first and second opposing axial cam elements positioned on the hollow shaft and a spring positioned on the hollow shaft. The first and second opposing axial cam elements can be oriented relative to one another such that rotation of the arm toward the base causes the first and second axial cam elements to move away from one another along the hollow shaft thereby compressing the spring.

21 Claims, 14 Drawing Sheets

(51) Int. Cl.

| | |
|---|---|
| *F16M 11/20* | (2006.01) |
| *E05D 3/12* | (2006.01) |
| *E05D 5/10* | (2006.01) |
| *E05D 11/00* | (2006.01) |
| *E05D 11/08* | (2006.01) |
| *H05K 5/00* | (2006.01) |
| *H05K 5/02* | (2006.01) |

(52) U.S. Cl.
CPC ......... *H05K 5/0226* (2013.01); *H05K 5/0234* (2013.01); *E05D 2005/102* (2013.01); *E05D 2011/085* (2013.01); *E05Y 2900/606* (2013.01); *F16M 2200/041* (2013.01); *F16M 2200/044* (2013.01)

(56) References Cited

U.S. PATENT DOCUMENTS

| | | | |
|---|---|---|---|
| 4,447,026 A | | 5/1984 | Maraghe |
| 4,589,613 A | | 5/1986 | Opsahl |
| 5,600,868 A | | 2/1997 | Tourville et al. |
| 5,640,690 A | | 6/1997 | Kudrna |
| 5,682,644 A | * | 11/1997 | Bohacik .................. E05F 1/061 16/284 |
| 5,876,008 A | | 3/1999 | Sweere et al. |
| 6,011,699 A | * | 1/2000 | Murray .................. G06F 1/1616 361/814 |
| 6,427,288 B1 | | 8/2002 | Saito |
| 6,505,382 B1 | | 1/2003 | Lam et al. |
| 6,822,857 B2 | | 11/2004 | Jung et al. |
| 6,871,384 B2 | | 3/2005 | Novin et al. |
| 7,145,768 B2 | | 12/2006 | Hillman et al. |
| 7,171,247 B2 | * | 1/2007 | Han ..................... G06F 1/1616 16/303 |
| 7,320,152 B2 | * | 1/2008 | Lowry .................... E05C 17/64 16/297 |
| 7,334,296 B2 | * | 2/2008 | Park ................... H04M 1/0216 16/303 |
| 7,461,433 B2 | | 12/2008 | Pan et al. |
| 7,478,786 B2 | | 1/2009 | Copeland |
| 7,486,974 B2 | * | 2/2009 | Pan ..................... E05D 11/0081 455/575.1 |
| 7,506,853 B2 | | 3/2009 | Sweere et al. |
| 7,766,288 B2 | | 8/2010 | Kim et al. |
| 8,035,957 B2 | * | 10/2011 | Jung .................... F16M 11/105 248/917 |
| 8,104,142 B2 | | 1/2012 | Lowry et al. |
| 8,451,601 B2 | | 5/2013 | Bohn et al. |
| 8,608,221 B1 | | 12/2013 | Krajenke et al. |
| 8,672,277 B2 | | 3/2014 | Hsu |
| 8,888,062 B2 | | 11/2014 | Novin |
| 9,004,436 B2 | | 4/2015 | Chen |
| 9,155,235 B2 | | 10/2015 | Lindblad et al. |
| 9,411,365 B1 | * | 8/2016 | Tanner .................. G06F 1/1618 |
| 9,448,583 B1 | | 9/2016 | Lee et al. |
| 2002/0123366 A1 | * | 9/2002 | Doraiswamy ....... H04M 1/0216 455/575.3 |
| 2004/0137970 A1 | | 7/2004 | Han |
| 2005/0247832 A1 | | 11/2005 | Cho et al. |
| 2005/0266901 A1 | * | 12/2005 | Pan ..................... H04M 1/0216 455/575.3 |
| 2006/0096063 A1 | * | 5/2006 | Duan .................. H04M 1/0216 16/303 |
| 2007/0151079 A1 | | 7/2007 | Lu et al. |
| 2007/0152125 A1 | | 7/2007 | Lee |
| 2010/0107366 A1 | * | 5/2010 | Duan .................. H04M 1/0216 16/297 |
| 2011/0062304 A1 | | 3/2011 | Hsieh et al. |
| 2011/0242756 A1 | | 10/2011 | Degner et al. |
| 2011/0299233 A1 | | 12/2011 | Kim |
| 2012/0262857 A1 | | 4/2012 | Fukaya et al. |
| 2012/0328222 A1 | | 12/2012 | Chen et al. |
| 2013/0021723 A1 | | 1/2013 | Harper et al. |
| 2014/0063750 A1 | | 3/2014 | Mau et al. |
| 2014/0085798 A1 | | 3/2014 | Myerchin |
| 2015/0097092 A1 | | 4/2015 | Fu et al. |
| 2015/0265048 A1 | | 9/2015 | Lindblad |
| 2016/0161045 A1 | | 6/2016 | Lee et al. |
| 2016/0201367 A1 | | 7/2016 | Kato |

FOREIGN PATENT DOCUMENTS

| | | | | |
|---|---|---|---|---|
| CN | 101669080 A | | 3/2010 | |
| CN | 201651697 U | | 11/2010 | |
| CN | 102401001 A | | 4/2012 | |
| EP | 0422882 A1 | | 4/1991 | |
| EP | 2549169 A2 | * | 1/2013 | ............. F16M 11/00 |
| EP | 2549169 A2 | * | 1/2013 | ......... F16M 11/2021 |

OTHER PUBLICATIONS

Non-Final Office Action dated Jul. 13, 2017 from U.S. Appl. No. 15/099,441, 46 pages.
International Search Report and Written Opinion dated Jul. 18, 2017 from PCT Patent Application No. PCT/US2017/027081, 27 pages.
Response filed Oct. 9, 2017 to Non-Final Office Action dated Jul. 13, 2017 from U.S. Appl. No. 15/099,441, 9 pages.
"International Search Report and written opinion Issued in PCT Application No. PCT/US17/044271", dated Oct. 9, 2017, 14 Pages.
"Counterbalance Torsion Spring System", retrieved at <<http://www.cbal.com/uploads/3/3/6/7/3367458/brochure_cbal_2013.pdf>> on May 20, 2016, 2 pages.
"Office Action and Search Report Issued in Chinese Patent Application No. 201780049375.9", dated Jan. 13, 2020, 17 Pages.

* cited by examiner

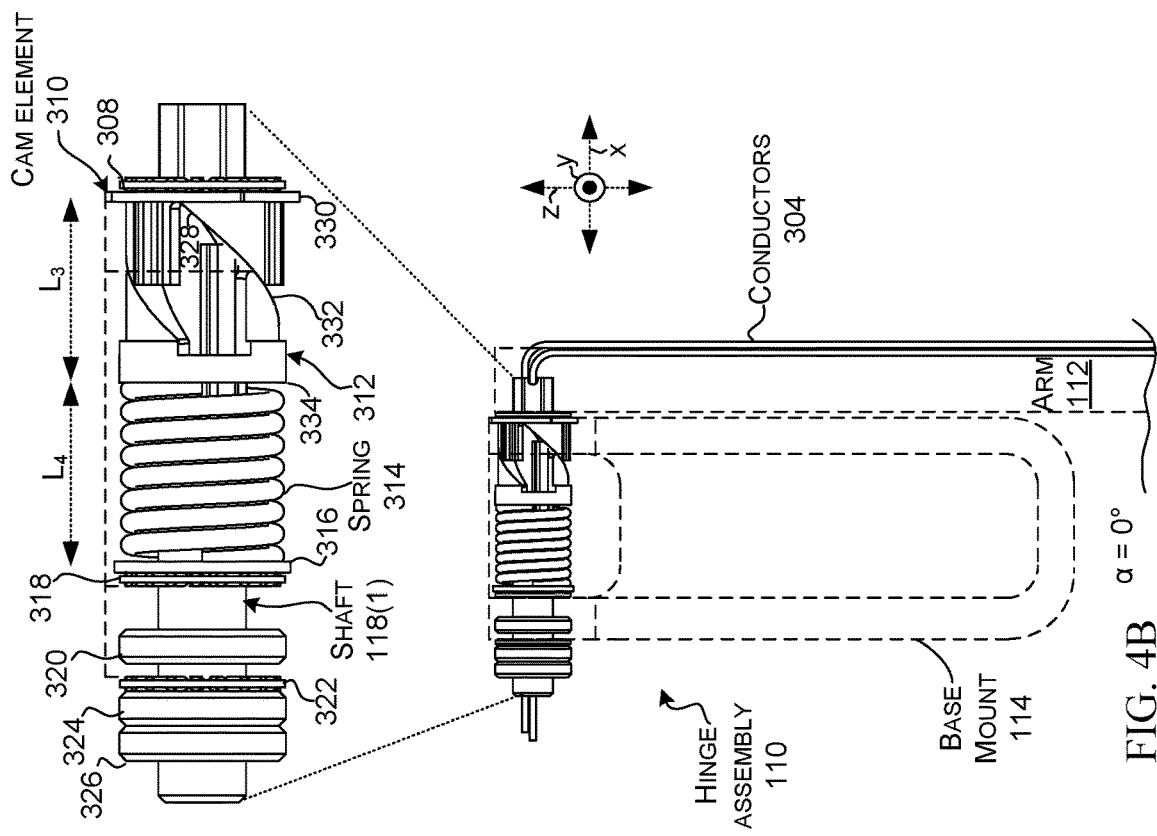
FIG. 4B  α = 0°
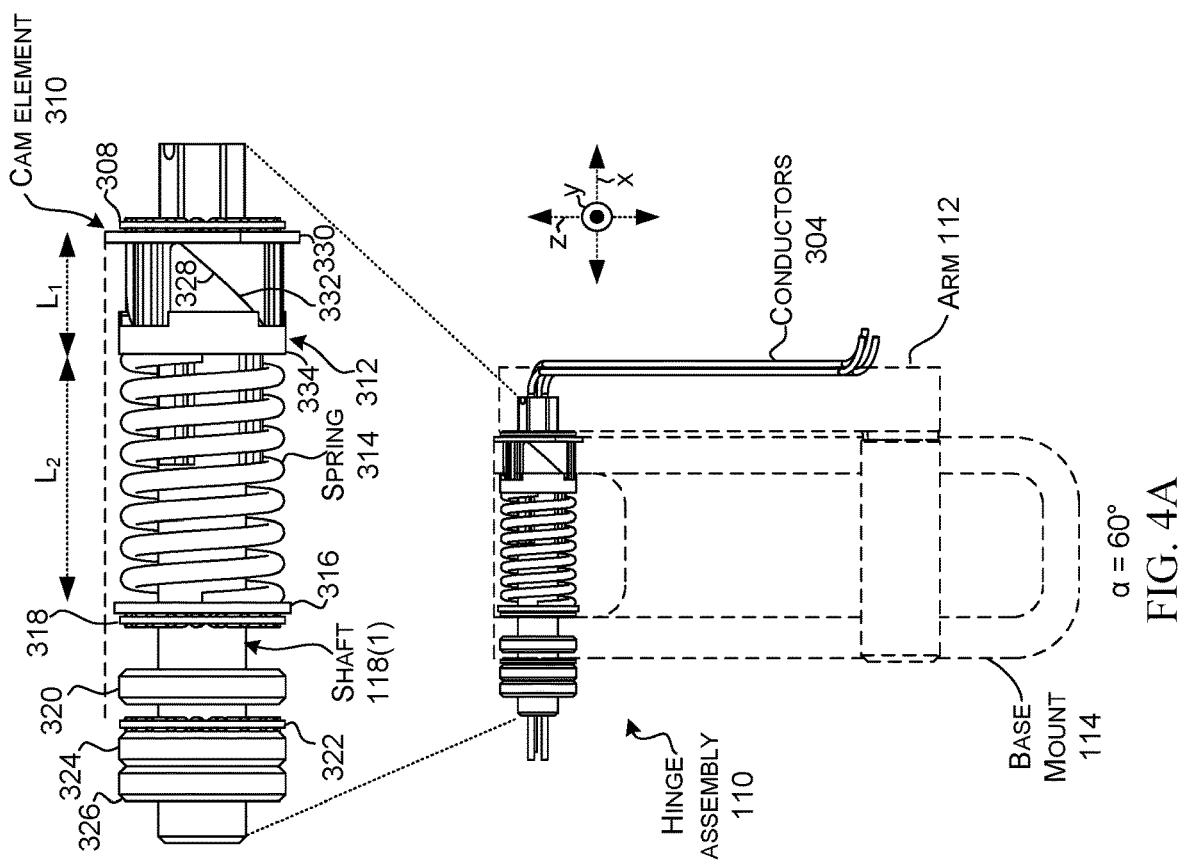
FIG. 4A  α = 60°

AXIAL CAM HINGE

BACKGROUND

The description relates to devices and specifically to hinged devices, such as devices employing a hinge to position a display.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 1A-1B, 2A-2D, 3A, 4A, 4B, 5A-5C, and 6 are elevational views of example devices in accordance with the present concepts.

DESCRIPTION

The present concepts relate to devices, such as computing devices that can include a display that can be positioned via a hinge. Axial cams and a spring can be used to balance the display at a given position. The axial cam and spring solution can be compact (e.g., take up relatively little space in the device) and can be extremely robust and reliable. Further, the axial cam and spring solution can allow torque supplied to balance the display to have a profile that counters torque imparted on the arm by the display, whether the imparted torque profile is linear or non-linear.

Introductory FIGS. 1A-1B and 2A-2D collectively show example device implementations.

Figure 1A:
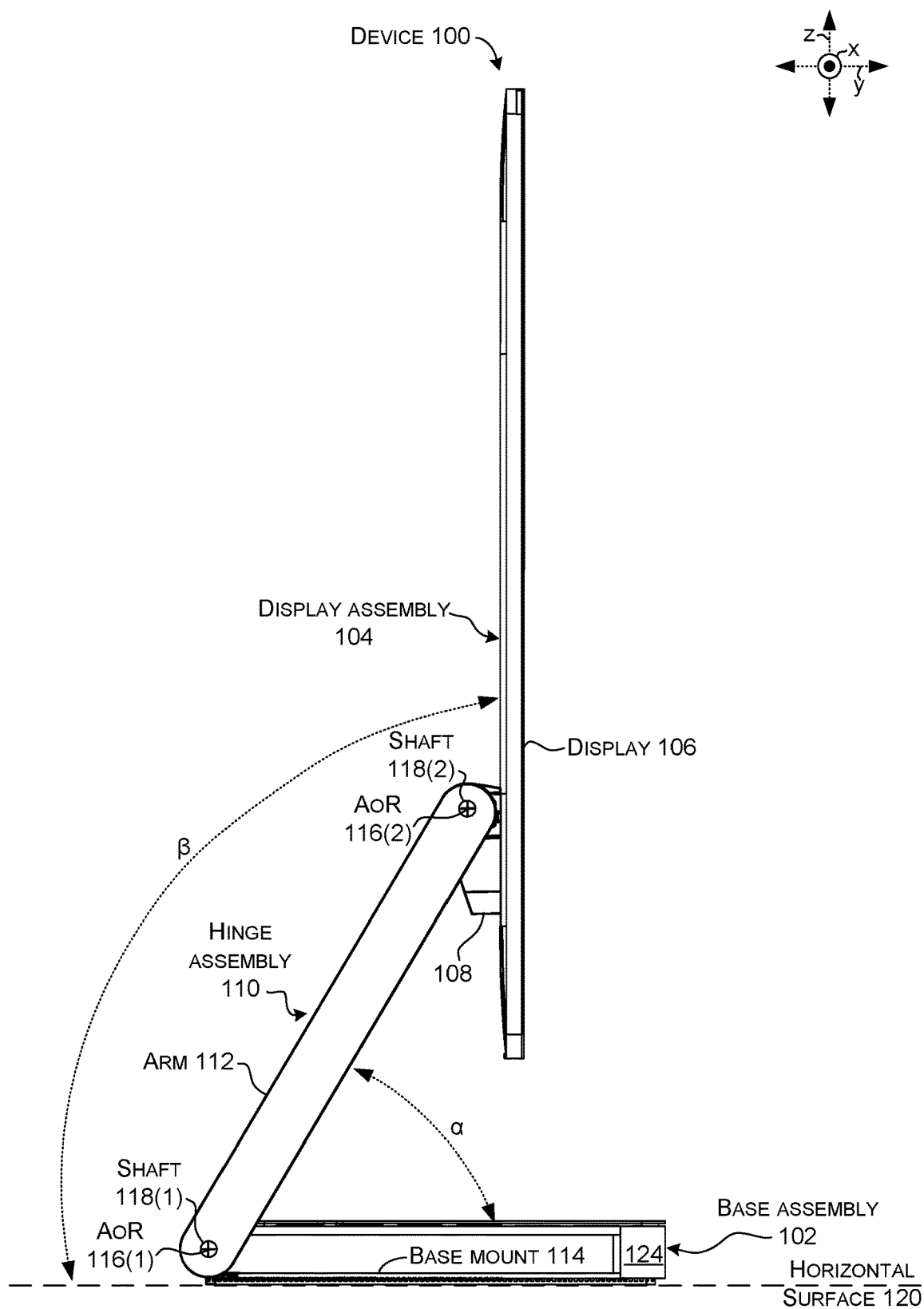
Figure 1B:
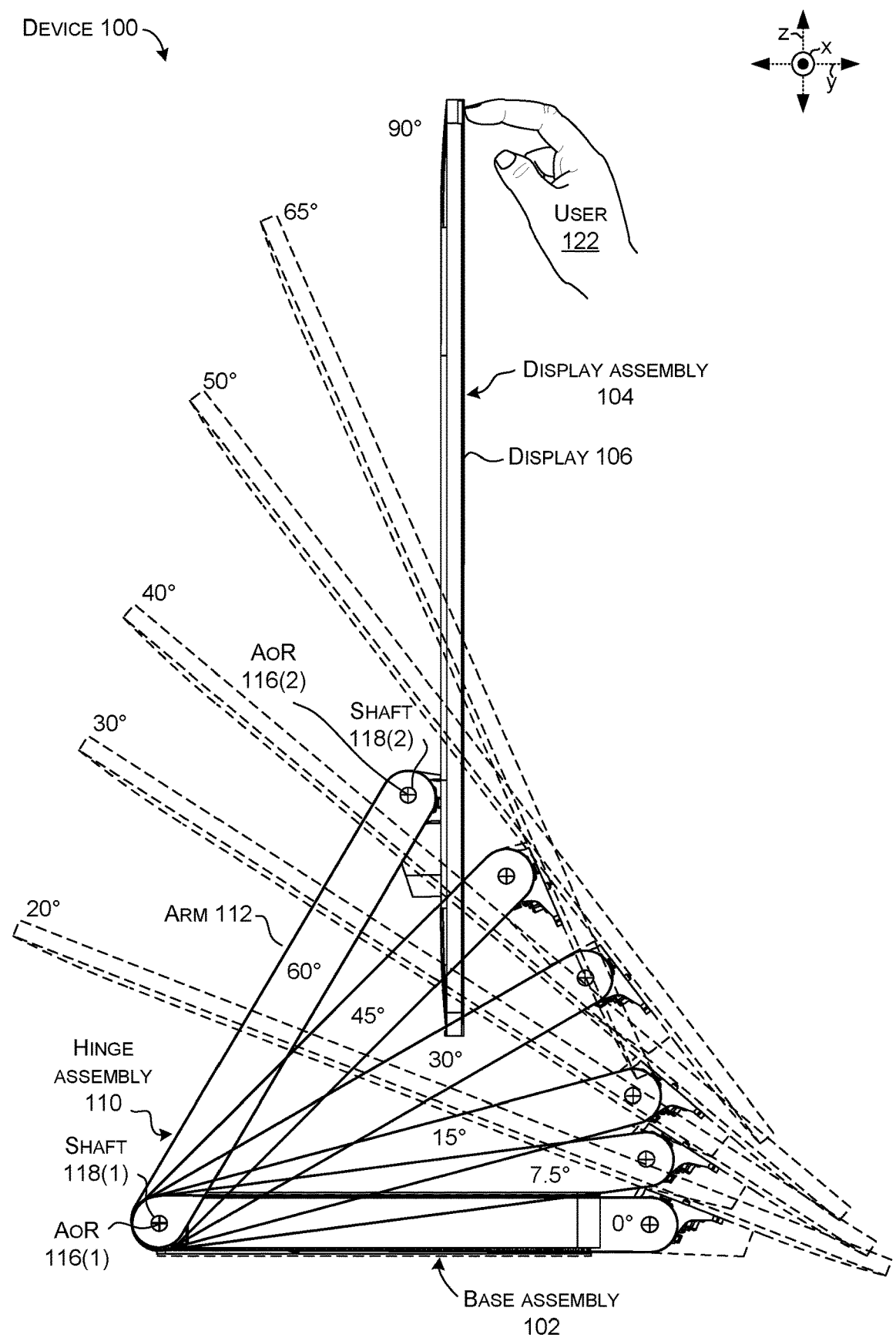
Figure 2A:
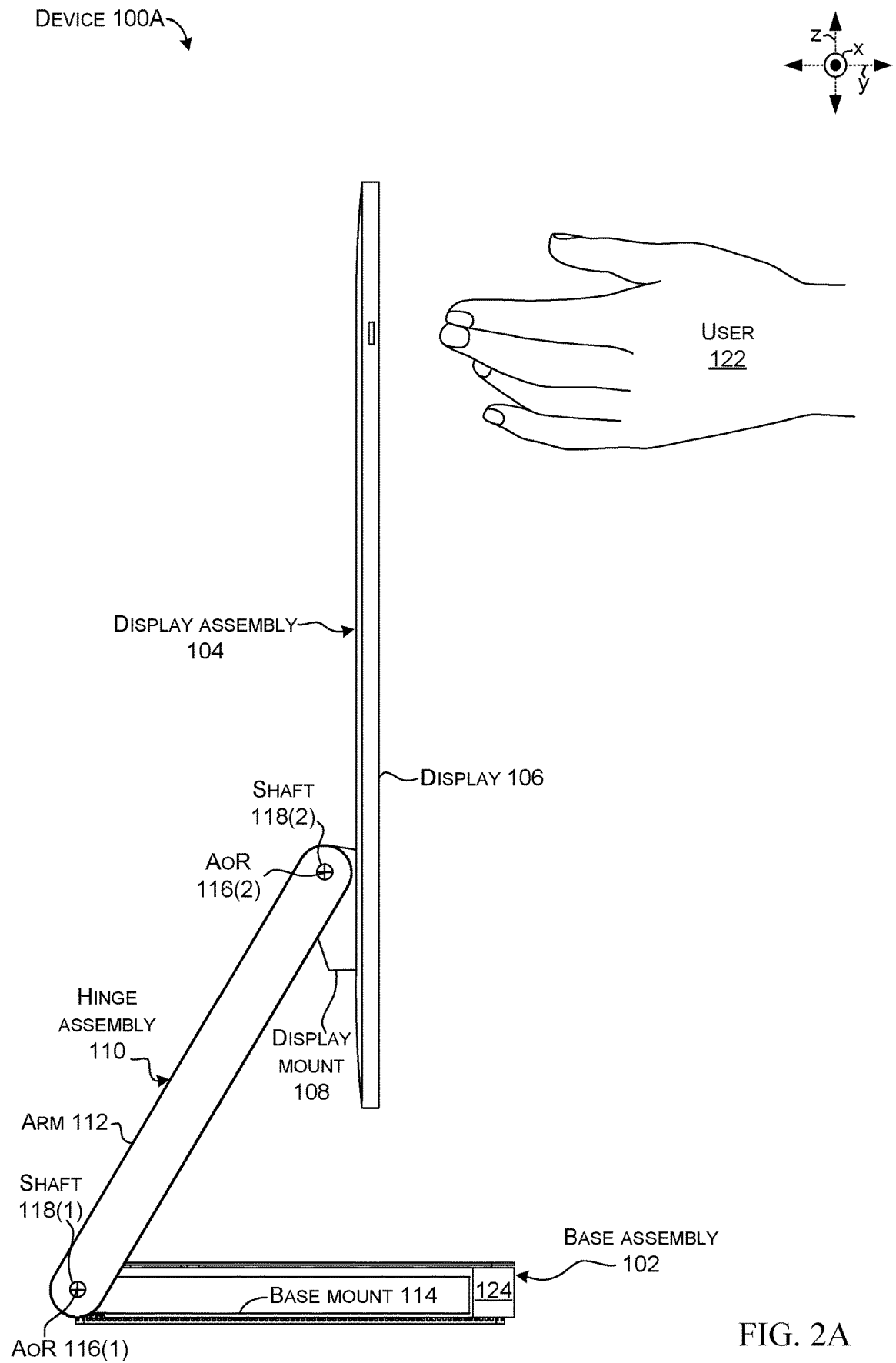
Figure 2B:
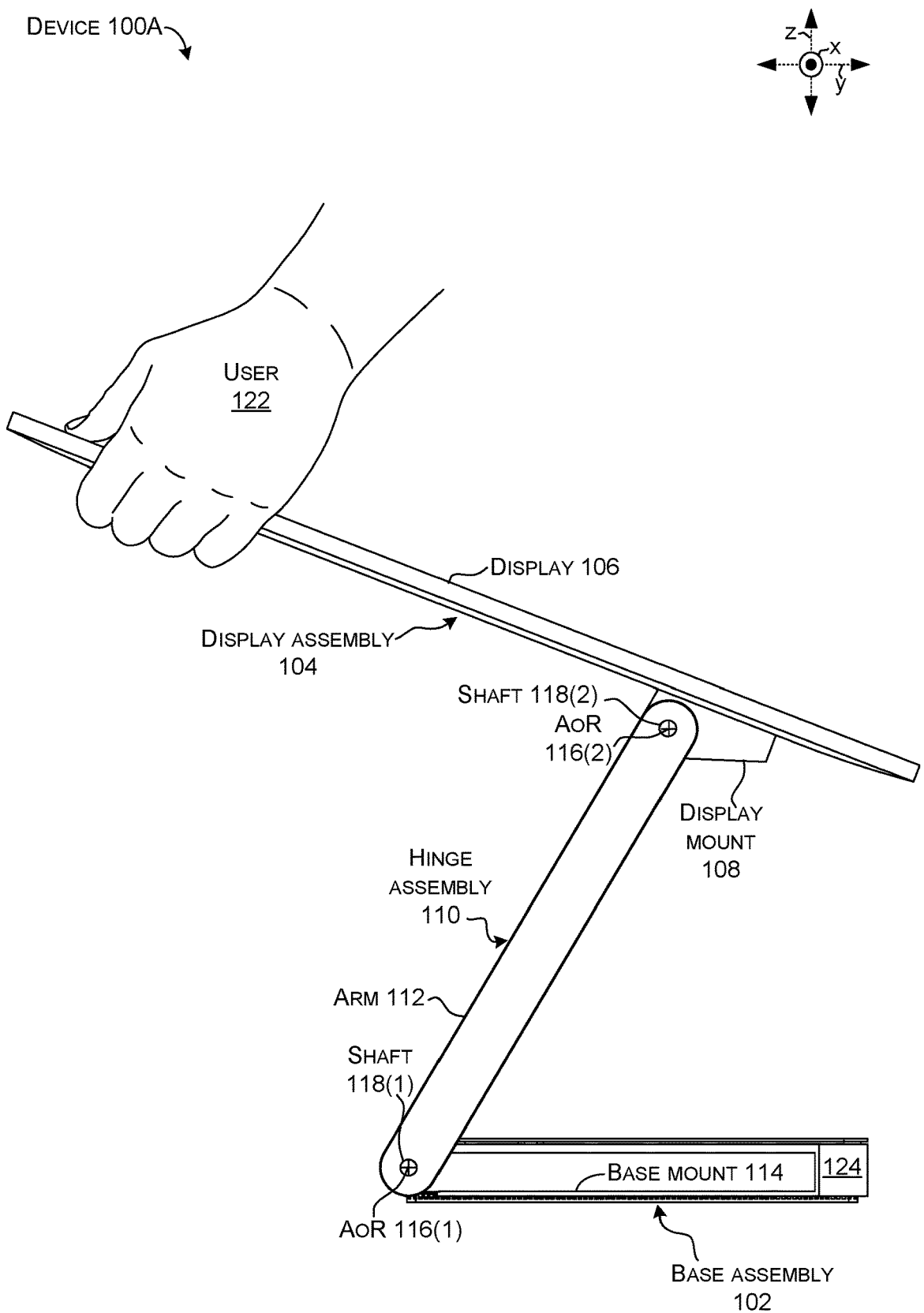
Figure 2C:
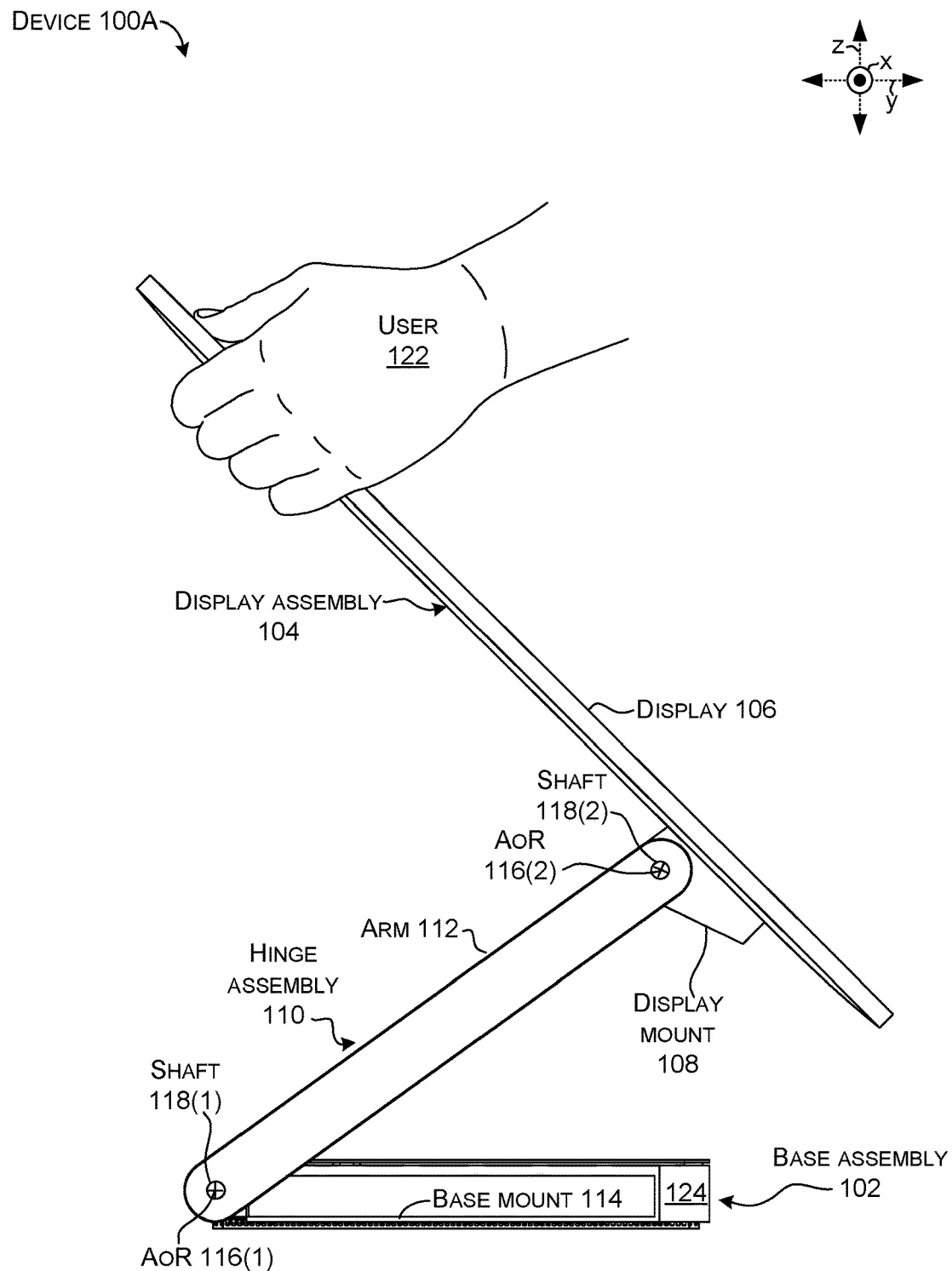
Figure 2D:
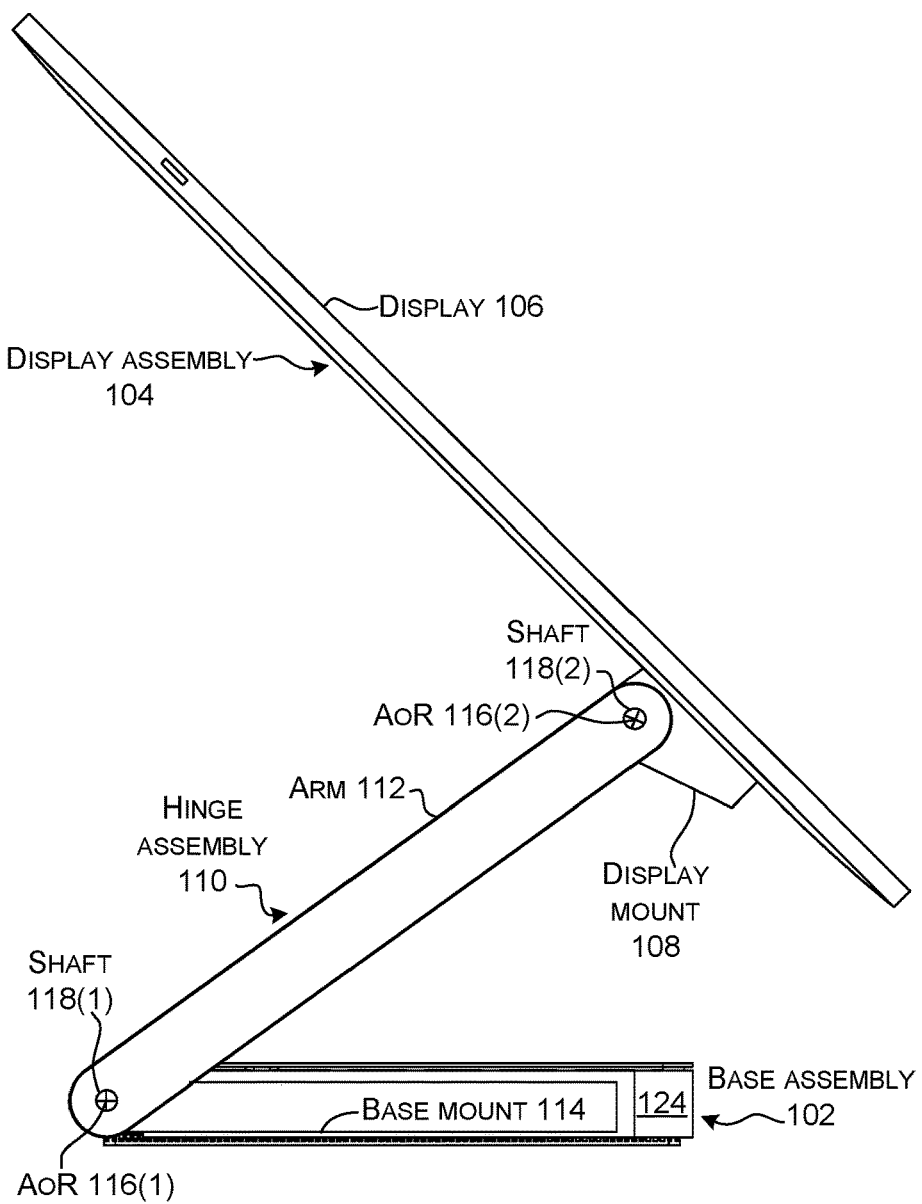

FIGS. 1A and 1B collectively show device 100 that can include a first portion in the form of a base assembly 102 and a second portion in the form of a display assembly 104 that can include a display 106 secured to a display mount 108. A hinge assembly 110 can include an arm 112 and a base mount 114. The base mount can be positioned in the base assembly 102. The hinge assembly 110 can rotatably couple the first and second portions around an axis of rotation (e.g., "axis") 116 defined by a shaft 118 (e.g., the axis is coextensive with the shaft). In this case, the hinge assembly includes two axes of rotation 116(1) and 116(2) associated with shafts 118(1) (e.g., base shaft) and 118(2) (e.g., display shaft). Other hinge assembly implementations may include a single axis of rotation. Still other hinge assembly implementations may include three or more axes of rotation.

In the illustrated implementation, rotation around the first axis of rotation (e.g., axis) 116(1) can define an angle alpha or 'α' between the hinge assembly 110 and the base assembly 102 (e.g., between the hinge arm 112 and a horizontal surface 120 upon which the device is positioned). Rotation around hinge axes 116(1) and 116(2) can define an angle beta or 'β' between the display assembly 104 and the horizontal surface 120. In this case the alpha and beta angles are tied to another. For instance, a fifteen degree alpha angle can correspond to a forty degree beta angle. A user 122 can position the display 106 with the desired alpha and/or beta angles, and the hinge assembly 110 can maintain the angles until changed again by the user.

The device 100 can also include various electronics 124, such as a processor for driving display 106. The processor can be manifest as a general purpose processor, microcontroller, application specific integrated circuit (ASIC), system on a chip (SoC), etc. Specific examples of electronics 124 are described above. Other examples of electronics 124 can include storage, memory, buses, etc. The term "device," "computer," or "computing device" as used herein can mean any type of device that has some amount of processing capability and/or storage capability. Processing capability can be provided by one or more processors that can execute data in the form of computer-readable instructions to provide a functionality. Data, such as computer-readable instructions and/or user-related data, can be stored on storage, such as storage that can be internal or external to the computer. The storage can include any one or more of volatile or non-volatile memory, hard drives, flash storage devices, and/or optical storage devices (e.g., CDs, DVDs etc.), remote storage (e.g., cloud-based storage), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

FIGS. 2A-2D show another example device 100A. (The suffix 'A' is used on device 100A to convey that components of this device may be the same and/or different from those of device 100 of FIGS. 1A-1B. To avoid clutter on the drawing page the 'A' suffix is not carried through to individual components). In this implementation, the user can set the alpha and beta angles independently and once selected the hinge assembly 110 can maintain the alpha and beta angles until changed again by the user.

Figure 3A:
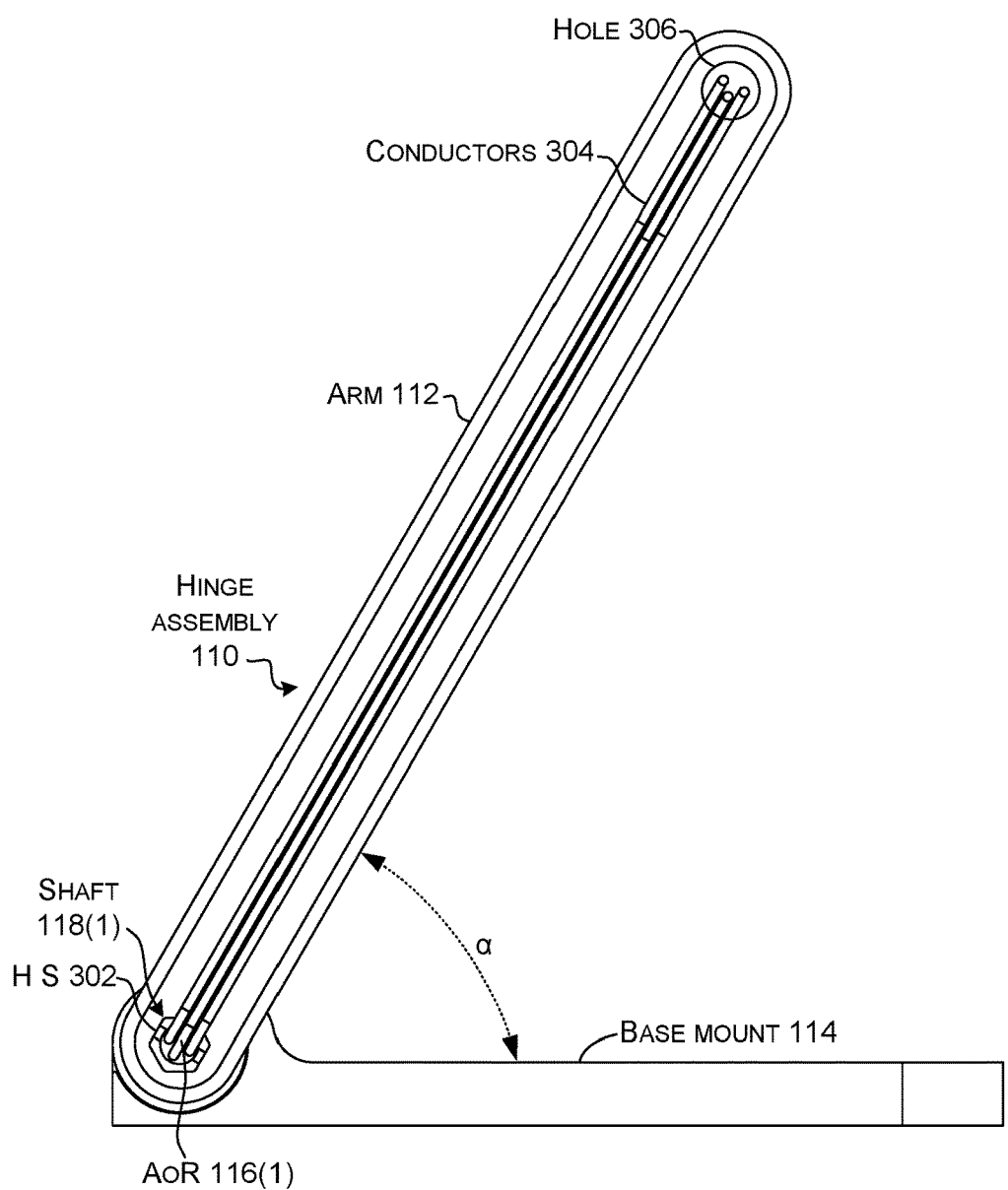
Figure 3C:
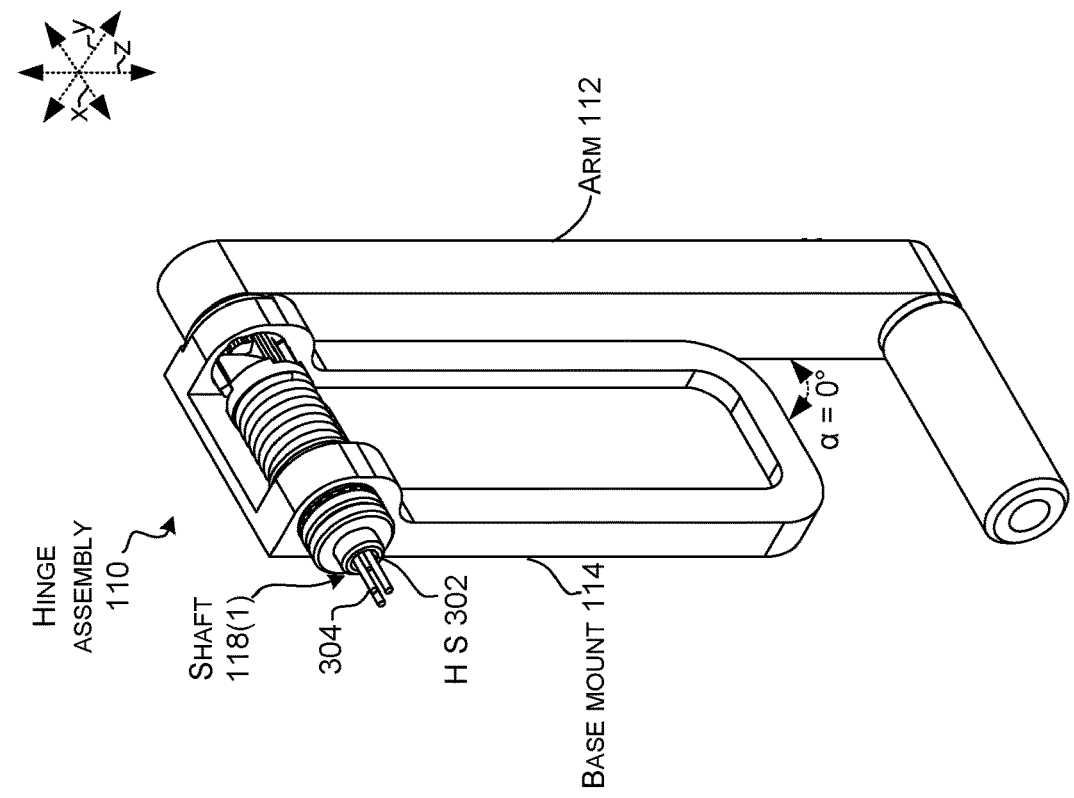
FIGS. 3B, 3C, 4C, and 4D are perspective views of example devices in accordance with the present concepts.
Figure 3B:
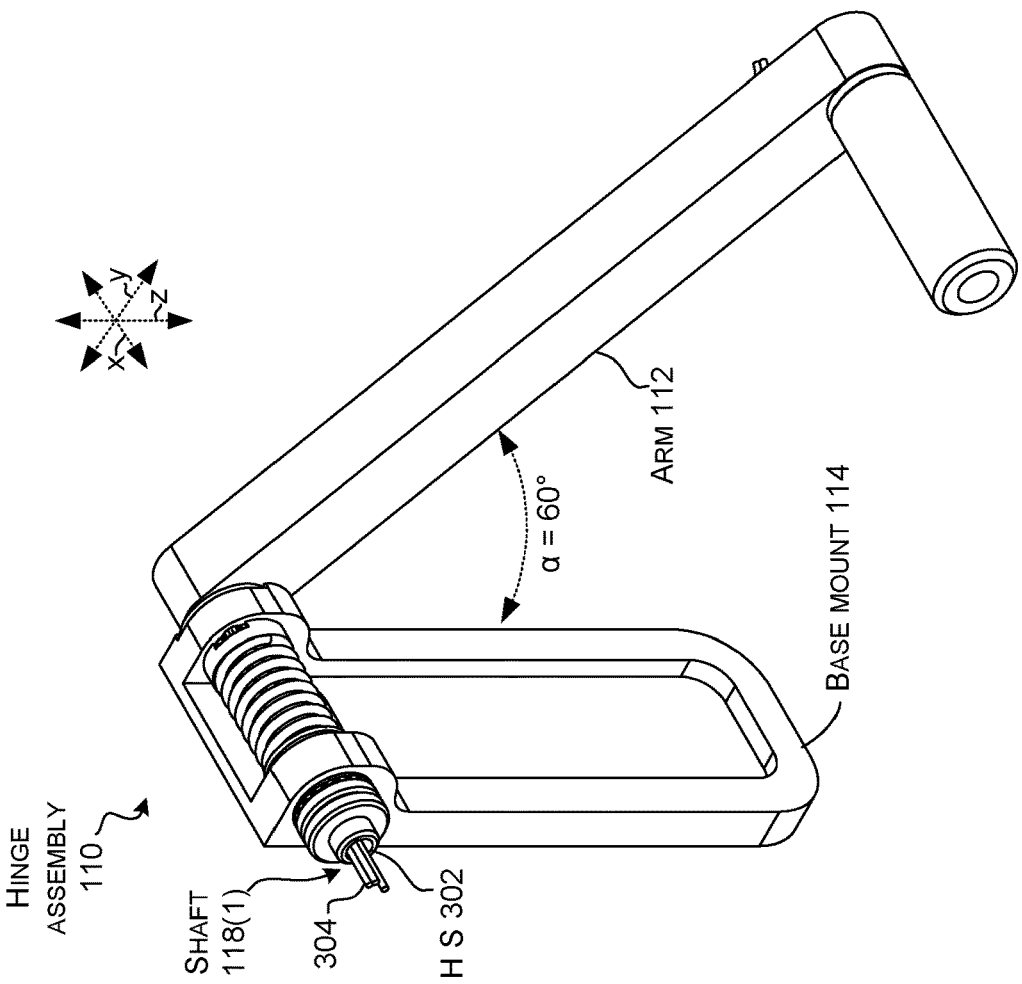
Figure 3D:
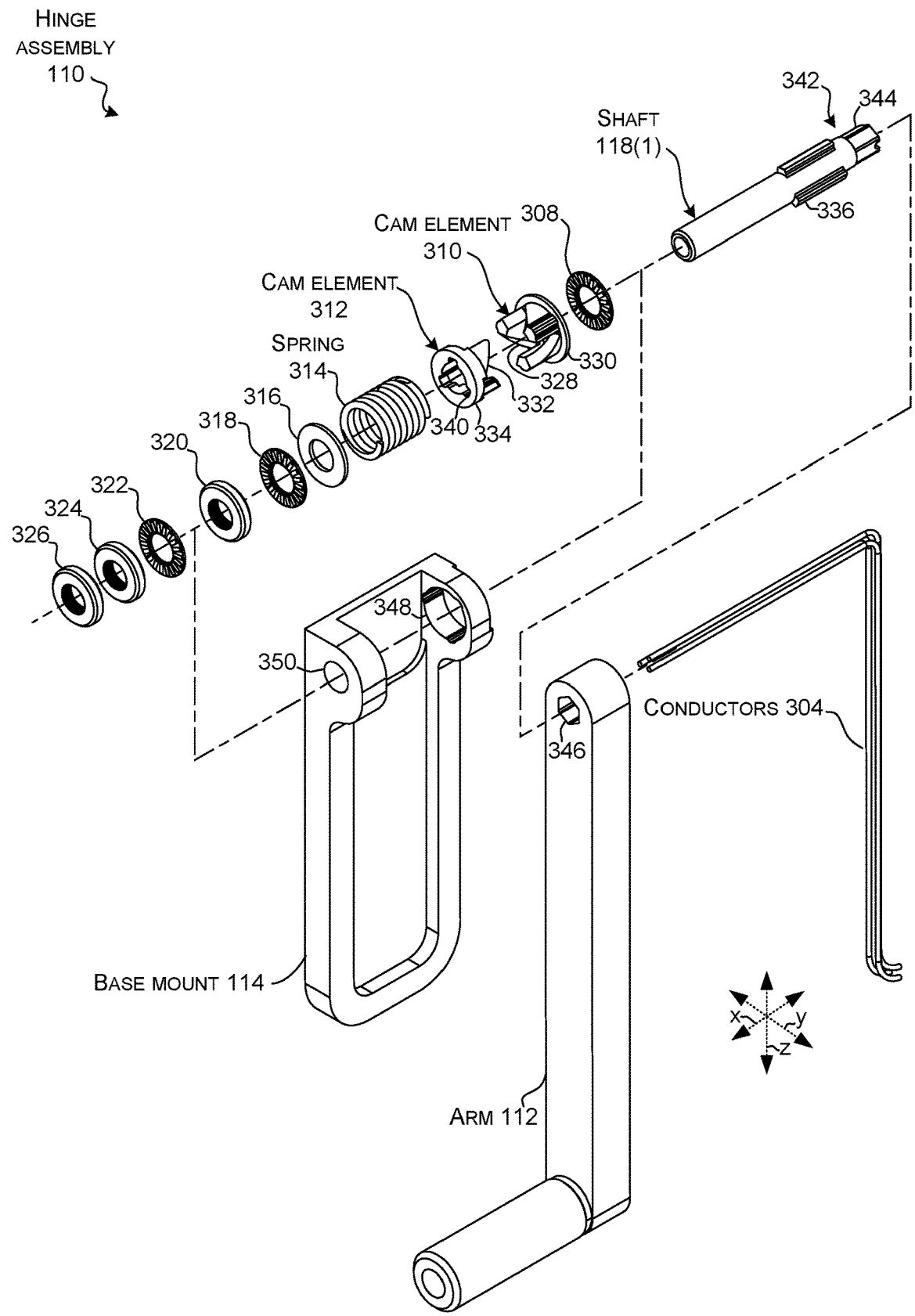
FIGS. 3D and 3E are exploded perspective views of an example device in accordance with the present concepts.
Figure 3E:
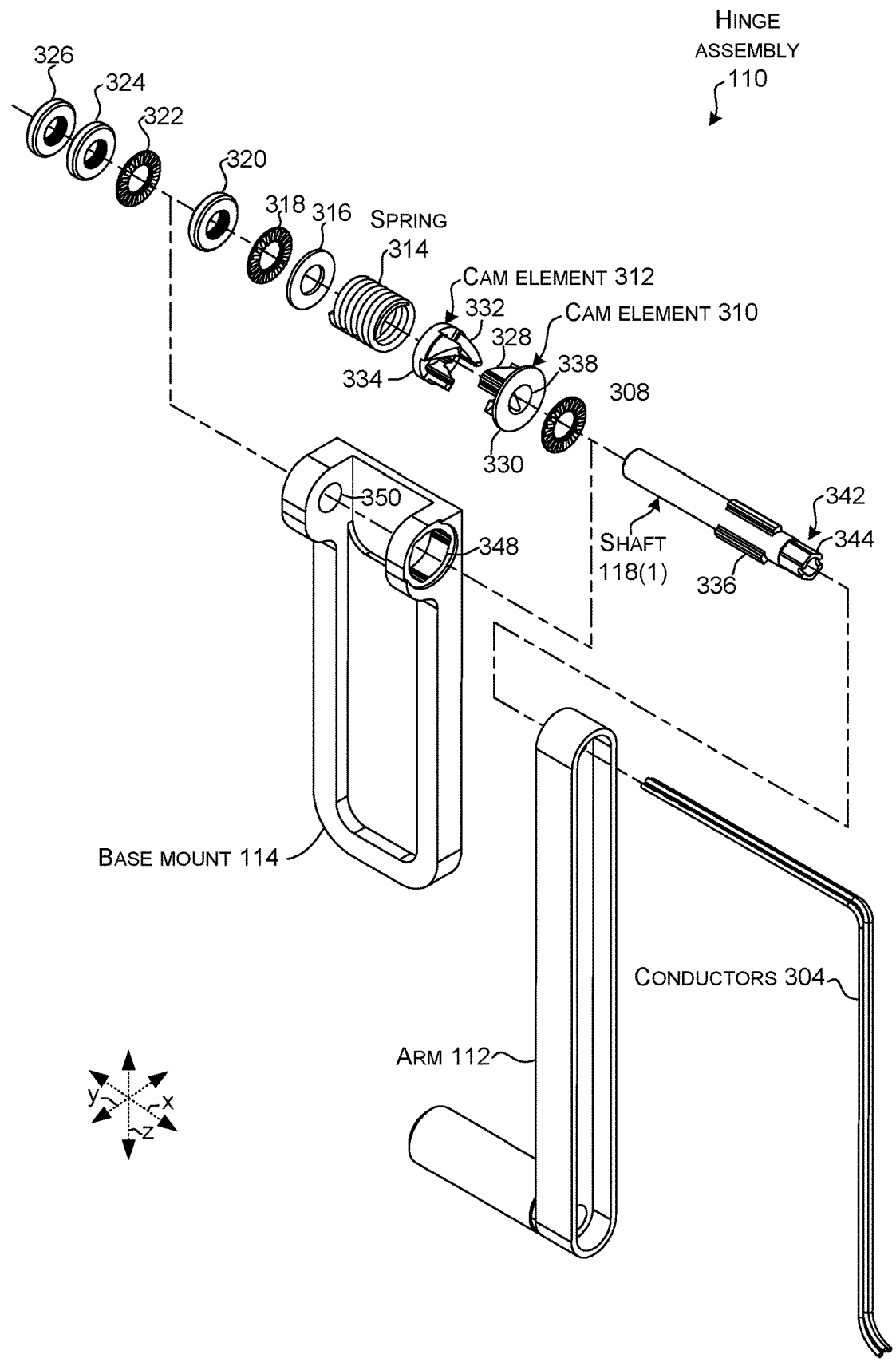

FIGS. 3A-3E collectively show a portion of device 100 relating to the hinge assembly 110. FIG. 3A is a similar to FIG. 2A with an alpha angle of about sixty degrees. FIG. 3B is a perspective view of hinge assembly 110 at the sixty degree alpha angle of FIG. 3A. FIG. 3C is a perspective view of the hinge assembly 110 at a zero degree alpha angle. FIG. 3D is an exploded perspective view at the zero degree alpha angle of FIG. 3C. FIG. 3E is a mirror image exploded perspective view to FIG. 3D.

In this case, shaft 118(1) is manifest as a hollow shaft 302. Conductors 304 can extend from the base mount 114, through the hollow shaft 302, into and up arm 112 and into the display (not shown in this view) via hole 306 in the arm 112. In this implementation, arranged along the shaft 118(1) are a friction reducing structure 308, first axial cam element 310 (e.g., cam element proximate to the arm 112), second axial cam element 312 (e.g., cam element distal to the arm 112), spring 314, washer 316, friction reducing structure 318, adjusting nut 320, friction reducing structure 322, lock washer 324, and adjusting nut 326. Various friction reducing structures 308, 318, and/or 322 can be employed, such as low friction washers, e.g., brass or Teflon washers, and/or roller bearings (e.g., roller bearing thrust washers), among others.

The first cam element 310 can include a first cam surface 328 and a first cam body 330. The second cam element 312 can include a second cam surface 332 and a second cam body 334.

The shaft 118(1) can include a structure to limit rotation of one of the first cam element 310 or second cam element 312 around the shaft (e.g., axial movement). In this implementation, the structure can be manifest as a key 336. (In this case, the key includes three fins, but only one is specifically designated on the drawing page to avoid clutter). First cam element 310 has a bore 338 that is larger than the key 336 and thus can rotate around the shaft. Second cam element 312 has a keyway 340 that corresponds to the key 336 and prevents the second cam element from rotating relative to the shaft. However, the shaft's key 336 and the second cam element's keyway 340 allow the second cam element 312 to move along the shaft 118(1) (e.g. translation on the shaft). Further, shaft 118(1) and/or arm 112 can include a fastening element 342 to lock the shaft and the arm in a fixed relation (e.g., when the arm rotates, the shaft rotates). In this case, the fastening element 342 is manifest as a keyed (e.g., hex) terminus 344 and a corresponding keyed hole 346 in the arm 112. The base mount 114 can have a first bore 348 sized to receive the cam elements 310 and 312. Note that second cam element 312 can rotate within first bore 348. In contrast, first cam element 310 is non-rotationally contained within first bore 348, such as by grooves on the outside of the first cam element and the inside of the first bore 348 (both shown but not specifically designated). The base mount can have a second bore 350 to receive shaft 118(1). Friction can be introduced into hinge assembly 110 by relative movement between any of the elements introduced above. Various friction reduction solutions (e.g., friction reducing structures 308, 318, and/or 322) are described above relative to FIGS. 3A-3E and additional friction reduction solutions are described below relative to FIG. 6.

Figure 4D:
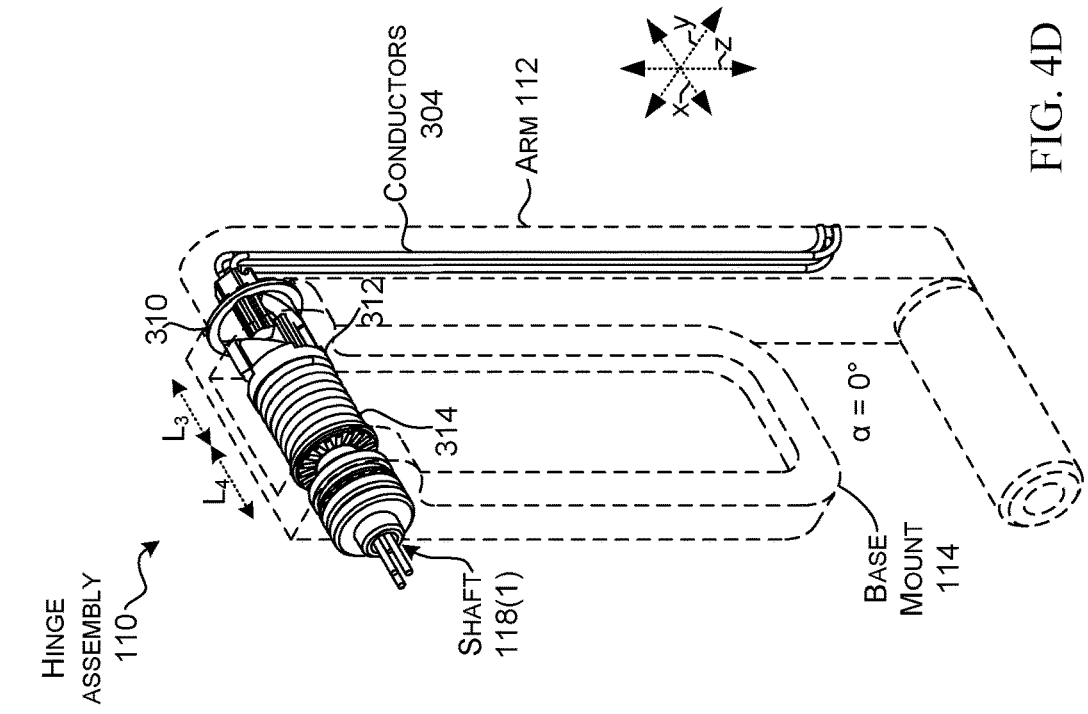
Figure 4C:
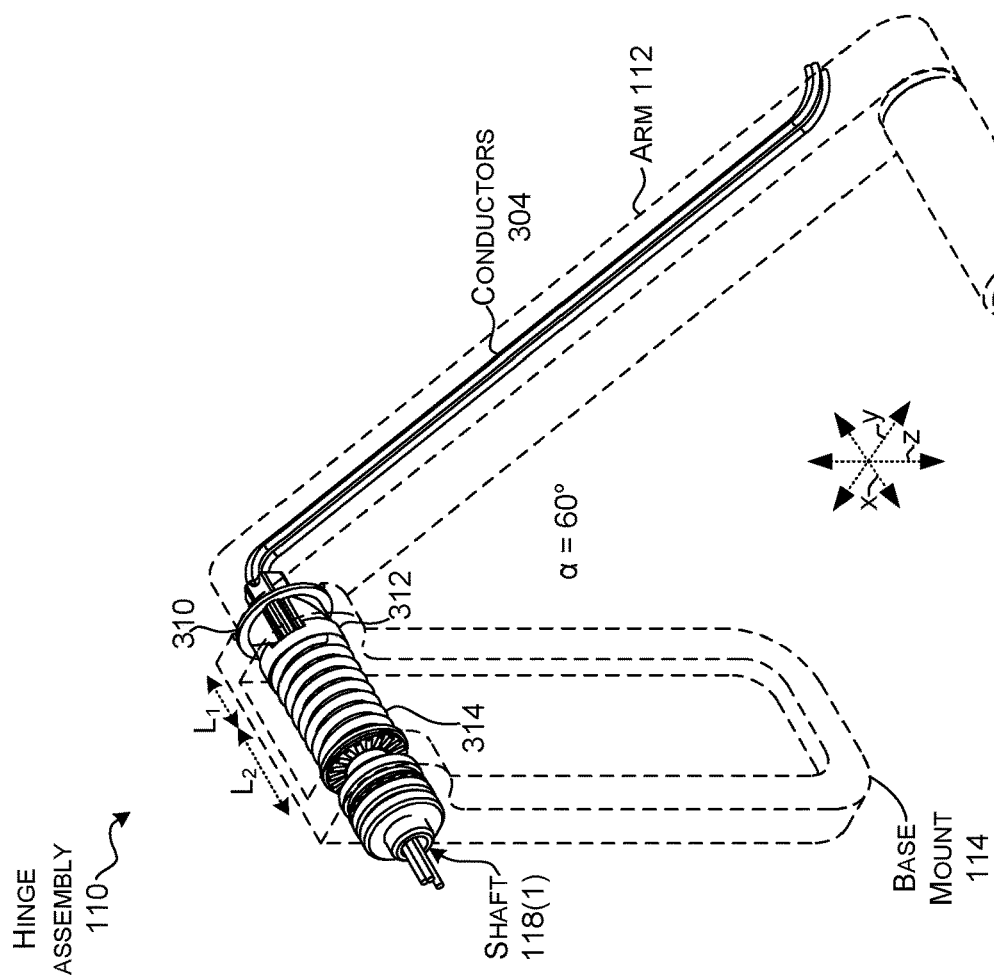

FIGS. 4A-4D collectively show how cam elements 310 and 312 in combination with spring 314 can create torque on the arm 112 to counter-balance the display (FIGS. 1A-2D) as the arm is rotated through a range of rotation (e.g., from a sixty degree alpha angle in FIGS. 4A and 4C to a zero degree alpha angle in FIGS. 4B and 4D). In this example, spring 314 is under compression between the base mount 114 and the second cam element 312 during the entire range of rotation. As such, the spring 314 creates a torque on the arm 112 that can counter-balance torque imparted on the arm by the display 106. Stated another way, the mass of the display (106, FIG. 1A) on the arm 112 can activate the cam elements 310 and 312 which push against the spring 314. The spring 314 can push back against the cam elements 310 and 312 to create the counter torque on the arm 112.

The counter-balancing torques (e.g., the torque and the counter torque) can create a weightless feel for the user because the display 106 can stay in place unless acted on by the user, but the display can move easily when the user moves it (e.g., weightless). In this example, when the user moves the display (e.g., the arm 112) from the sixty degree angle of FIGS. 4A and 4C to the zero degree angle of FIGS. 4B and 4D, the cam elements 310 and 312 operate on one another and compress the spring 314. Specifically, in this case, at the sixty degree position of FIGS. 4A and 4C, the cam elements 310 and 312 are biased toward one another to a length $L_1$ by the spring 314 which has a length $L_2$.

Recall that shaft 118(1) is secured to the arm 112 in a fixed manner. When the arm 112 is rotated by the user, the shaft 118(1) is rotated the same number of degrees. Recall from FIG. 3D, that second cam element 312 is fixed rotationally relative to shaft 118(1) by key 336 and keyway 340. Recall also that the first cam element 310 is secured to base mount 114 and thus cannot rotate. As such, rotation of arm 112 causes cam element 312 to rotate. Rotation of cam element 312 causes its cam surface 332 to engage corresponding cam surface 328 of first cam element 310. Since cam element 310 cannot rotate, this interaction of the cam surfaces 332 and 328 creates a force that pushes second cam element 312 away from first cam element 310.

Recall that cam element 312 can move along shaft 118(1) but not around the shaft as dictated by shaft key 336 and keyway 340. This increase in length defined by the first and second cam elements 310 and 312 can be evidenced by comparing length $L_3$ to length $L_1$. Correspondingly, the increase to length $L_3$ causes compression of spring 314 which is evidenced by comparing spring length $L_4$ to spring length $L_2$. Thus, the axial movement of the cam elements 310 and 312 due to interaction of cam surfaces 328 and 332 can cause compression of spring 314 which can increase counter-torque imparted on the arm 112 as the arm angle decreases.

In this implementation, the spring 314 functions as a compression spring that creates torque on arm 112. Two alternative configurations are described below. In one implementation shown relative to FIG. 5B, the spring can function as a compression spring and a torsion spring during the range of rotation. In another implementation, shown relative to FIG. 5C the spring can function as a compression spring for a sub-set of the rotation and both a compression spring and a torsion spring for another portion of the rotation. The various implementations can influence the torque profile imparted by the spring on the arm during the rotation. The spring configuration can be selected to produce a torque profile for a given device configuration to provide the 'weightless experience' through the range of rotation.

Also note that in the illustrated configuration of FIGS. 3A-3E and 4A-4B, the cam surfaces 328 and 332 of the first cam element 310 and the second cam element 312 are generally linear and are angled at about fortyfive degrees relative to the axis of rotation (e.g., along a long axis of the shaft 118(1)). Other implementations can adjust the torque profile by changing the shape and/or angle of the cam surfaces 328 and 332. One such example is described below relative to FIG. 6.

Figure 5A:
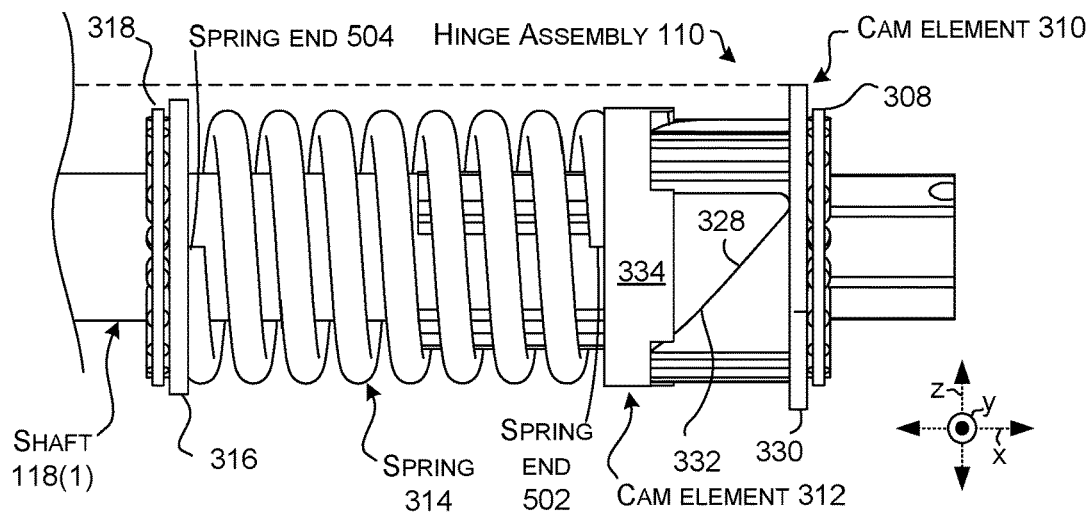
Figure 5B:
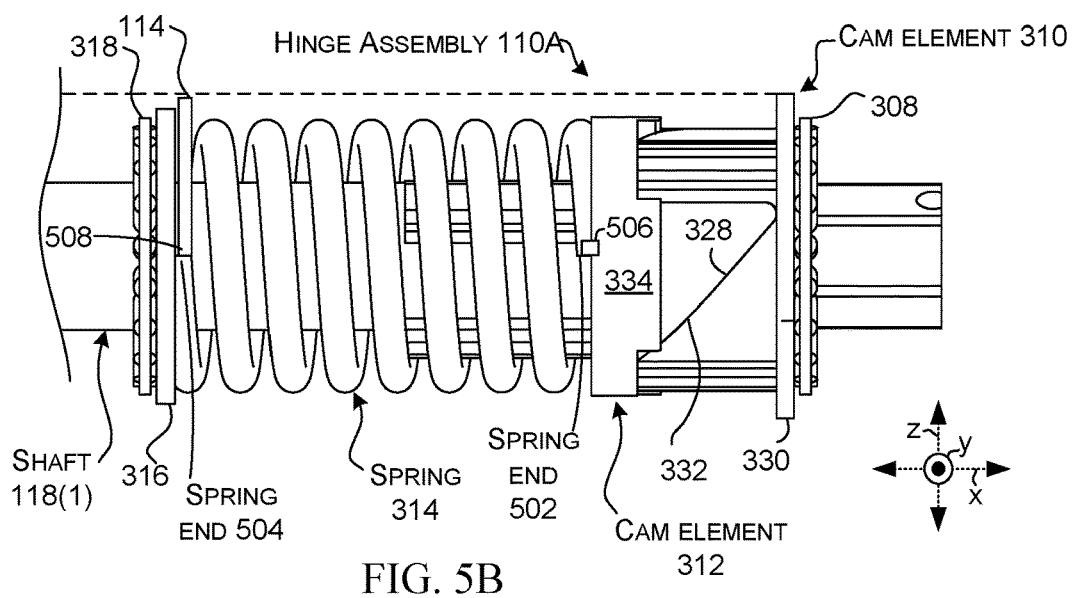
Figure 5C:
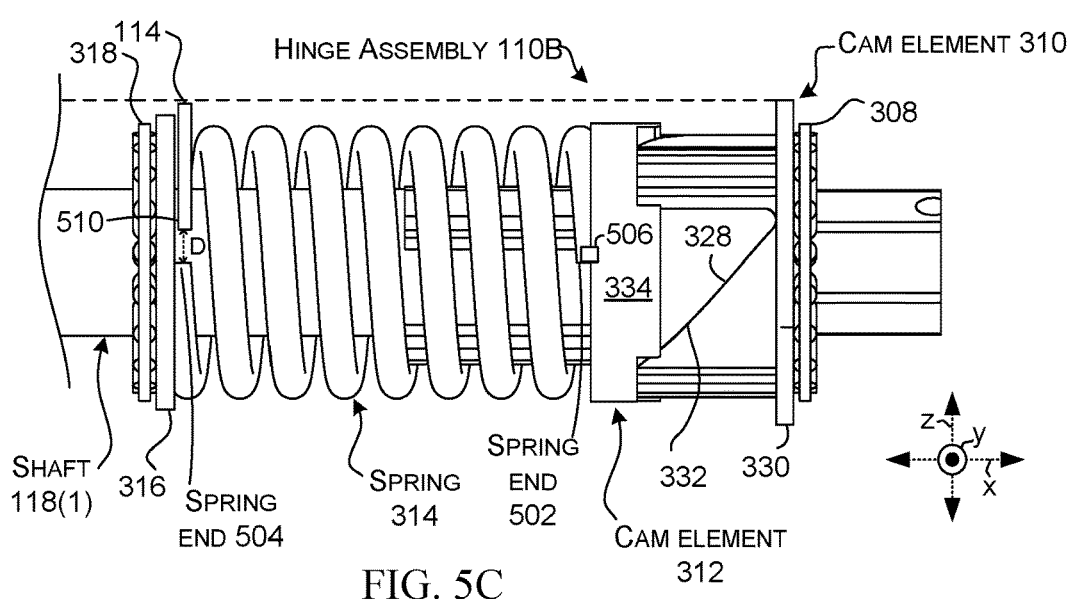

FIGS. 5A-5C show three example implementations of spring 314 in hinge assembly 110. The spring 314 extends from a first end 502 to a second end 504. FIG. 5A is the implementation represented in FIG. 3B-3E. In this case, spring ends 502 and 504 are unrestrained (e.g., free to rotate). Thus, when acted upon by the cam elements 310 and 312 (as a result of rotation of arm 112 relative to base mount 114), the spring 314 functions as a compression spring.

FIG. 5B shows an alternative implementation of spring hinge assembly 110A. In this case, first spring end 502 is secured to body 334 of second cam element 312 as indicated at 506. Also, second spring end 504 is secured to base mount 114 (only a portion of which is shown) as indicated at 508. Accordingly, cam action (e.g., translational movement of cam element 312 caused by rotation of arm 112) causes twisting of spring 314. The twisting can cause winding or unwinding of the spring depending on the configuration of the spring (e.g., clockwise or counter-clockwise). For instance, in the illustrated case, looking at the first spring end 502 from the perspective of the second spring end 504, spring 314 is wound counter-clockwise. Movement of arm 112 toward base mount 114 causes shaft 118(1) to rotate clockwise when viewing the shaft from the second spring end 504 toward the first spring end 502. Thus, this shaft rotation will wind or tighten spring 314. In an alternative implementation where the spring was wound clockwise, this rotation would partially unwind the spring.

Viewed from one perspective, in spring hinge assembly 110A, spring 314 can function as both a compression spring and as a torsion spring. Generally, a spring that functions as both a compression spring and a torsion spring allows more energy to be stored than in a similar spring that functions only as a compression spring.

FIG. 5C shows another alternative implementation of spring hinge assembly 110B. In this case, first spring end 502 is secured to body 334 of second cam element 312 as indicated at 506. Also, a tab 510 is positioned on base mount 114 rotationally aligned with second spring end 504. In this implementation, rotation of arm 112 causes cam action (e.g., translational movement of cam element 312) which compresses spring 314. For a first sub-set of this rotation represented by distance D (or alternatively radians), spring end 504 is free to rotate about base mount 114 and as such, the spring functions as a compression spring only. Once the second spring end 504 contacts tab 510, the spring end 504 is no longer able to rotate and for a remainder of the rotation (e.g., a second sub-set of the rotation) the spring also functions as a compression spring and a torsion spring, caused by rotation of arm 112 causing twisting of spring 314.

The twisting can cause winding or unwinding of the spring 314 depending on the configuration of the spring (e.g., clockwise or counter-clockwise). For instance, in the illustrated case, looking at the first spring end 502 from the perspective of the second spring end 504, spring 314 is wound counter-clockwise. Movement of arm 112 toward base mount 114 causes shaft 118(1) to be rotated clockwise when viewing the shaft from the second spring end 504 toward the first spring end 502. Thus, this shaft rotation will wind spring 314. In an alternative implementation where the spring was wound clockwise, this rotation would partially unwind the spring. The above compression spring, torsion spring, and combination compression/torsion spring examples provide a mechanism for customizing the counter-torque profile to a given device implementation. These compression/torsion spring configurations can be employed alone and/or in combination with the cam surface profile to obtain a desired counter-torque profile.

Figure 6:
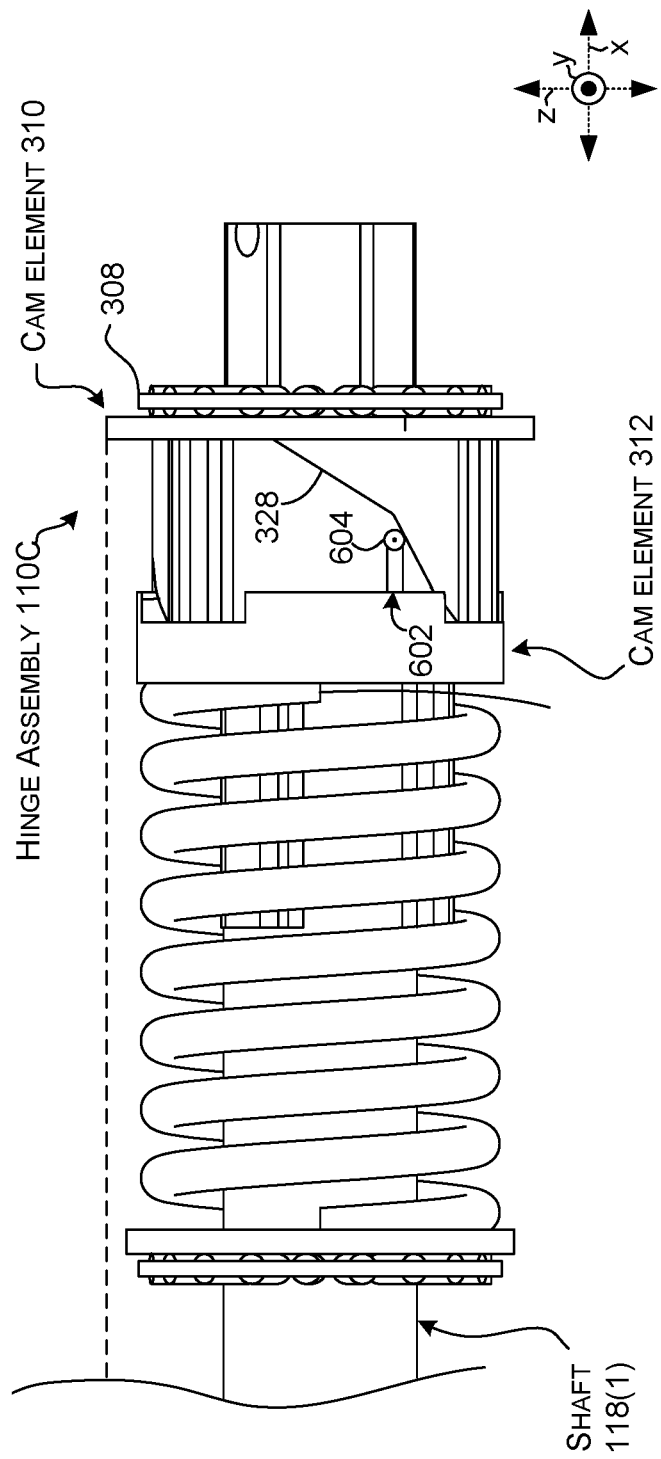

FIG. 6 shows a hinge assembly 110C that can employ an alternative cam surface profile. In this case, the cam surface 328 of the first cam element 310 includes two linear regions that have different slopes. The second cam element 312 is manifest as a cam follower 602 that can contact and follow the two different slopes of cam surface 328. In this case, the cam follower 602 includes a friction reducing structure in the form of a roller bearing 604 that rolls over the cam surface 328 and drives the cam follower 602 in the axial direction. This implementation offers another example of how the counter-torque profile can be customized for a given device application. Further, as mentioned above, any of the implementations can include friction reduction solutions at any or all sources of friction in the hinge assembly 110C. Example friction reduction solutions can include employing low friction materials or coatings to friction sources. The illustrated example employs a friction reduction solution in the form of roller bearings 604 on the cam surfaces. Friction reduction solutions can alternatively or additionally be employed at other friction sources; several such examples are described above relative to FIGS. 3A-3E.

Note that various implementations are contemplated where the first cam element 310 rotates with the shaft 118(1) and second cam element 312 is rotatably fixed to the base mount 114 (FIGS. 3A-3E). For torsional spring action (for example as explained relative to FIGS. 5B and 5C, the spring 314 could be fixed to the second cam element 312 and the shaft 118(1)).

Various implementation examples are described above. Additional examples are described below. One example includes a device that includes a display coupled to a first end of an arm and a base rotatably secured to a hollow shaft that is fixed to a second end of the arm. The hollow shaft can define an axis of rotation of the arm relative to the base. The base can further include first and second opposing axial cam elements positioned on the hollow shaft and a spring positioned on the hollow shaft. The first and second opposing axial cam elements can be oriented relative to one another such that rotation of the arm toward the base causes the first and second opposing axial cam elements to move away from one another along the hollow shaft thereby compressing the spring.

Another example can include any of the above and/or below examples where the first axial cam element rotates around the axis with the arm.

Another example can include any of the above and/or below examples where the second axial cam element comprises a cam follower.

Another example can include any of the above and/or below examples where the first axial cam element moves along the axis relative to the second axial cam element.

Another example can include any of the above and/or below examples where the second axial cam element moves along the axis relative to the first axial cam element.

Another example can include any of the above and/or below examples where the hollow shaft is keyed parallel to the axis and the second axial cam element includes a keyway that allows movement of the second axial cam element along the key parallel to the axis but prevents rotation of the second axial cam element around the axis.

Another example can include any of the above and/or below examples where the first axial cam element further comprises a first body and a first axial cam surface and wherein the second axial cam element further comprises a second body and a second axial cam surface and wherein the second axial cam surface is biased against the first axial cam surface by the spring.

Another example can include any of the above and/or below examples where the spring extends between a first end and a second end.

Another example can include any of the above and/or below examples where the spring is a compression spring that can rotate around the axis.

Another example can include any of the above and/or below examples where the spring is a torsion spring where the first end is secured relative to the second axial cam element and the second end is secured relative to the base.

Another example can include any of the above and/or below examples where the rotation comprises a range of rotation relative to the base.

Another example can include any of the above and/or below examples where in a first sub-set of the range of rotation, the spring is a compression spring that can rotate around the axis and in a second sub-set of the range of rotation the spring is also a torsion spring where the first end is secured relative to the second axial cam element and the second end is secured relative to the base.

Another example can include any of the above and/or below examples where the spring creates a linear torque on the arm through the range of rotation.

Another example can include any of the above and/or below examples where the spring creates a non-linear torque on the arm through the range of rotation.

Another example can include any of the above and/or below examples comprising conductors extending from the base through the hollow shaft into the arm and along the arm to the display.

Another example can include a device comprising a display coupled to a first end of an arm, a base rotatably secured to a hollow shaft that is fixed to a second end of the arm, a conductor extending from the base through the hollow shaft into the arm and from the arm to the display, and, first and second axial cam elements positioned on the hollow shaft and a spring positioned on the hollow shaft such that rotation of the arm toward the base causes the first and second axial cam elements to compress the spring.

Another example can include any of the above and/or below examples where one of the first and second axial cam elements rotates with the hollow shaft and the other of the first and second opposing axial cam elements is fixed to the base.

Another example can include a device comprising a base mount and an arm, and a hinge assembly rotatably coupling the base mount and the arm. The hinge assembly comprising a shaft having first and second cam elements positioned thereon and a spring positioned on the shaft and biasing the first and second cam elements toward one another. Rotation of the arm toward the base mount can cause the cam elements to compress the spring which can create a torque to counter further rotation of the arm toward the base mount.

Another example can include any of the above and/or below examples where the shaft is a hollow shaft and further comprising a conductor extending through the hollow shaft into the arm.

Another example can include any of the above and/or below examples comprising a display attached to the arm and wherein the conductor is connected to the display.

Another example can include any of the above and/or below examples where the spring functions simultaneously as both a compression spring and a torsion spring.

Although techniques, methods, devices, systems, etc., pertaining to hinge systems are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
   a display coupled to a first end of an arm, the display having a mass;
   a base rotatably secured to a hollow shaft that is fixed to a second end of the arm, the hollow shaft defining an axis of rotation of the arm relative to the base, the base further comprising first and second opposing axial cam elements positioned on the hollow shaft and a spring positioned on the hollow shaft, the hollow shaft including a key that is parallel to the axis, the second axial cam element including a keyway that corresponds to the key of the hollow shaft, the key and the keyway allowing the second axial cam element to move relative to the first axial cam element along the hollow shaft in parallel to the axis but preventing the second axial cam element from rotating with respect to the hollow shaft around the axis, the first axial cam element comprising a first cam surface that engages the second axial cam element, the first and second opposing axial cam elements oriented relative to one another such that movement of the arm toward the base causes the first and second opposing axial cam elements to move away from one another along the hollow shaft thereby compressing the spring, the mass of the display imparting a first torque that forces the first and second opposing axial cam elements away from each other and compresses the spring, the spring being configured to produce a second torque that counter-balances the first torque and creates a weightless feel for the display; and,
   a conductor extending from the base, into a first end of the hollow shaft, through the hollow shaft and through the spring, out a second end of the hollow shaft that is opposite the first end, and into the arm, and connected to the display.

2. The device of claim 1, wherein the first axial cam element rotates around the axis with the arm.

3. The device of claim 1, wherein the second axial cam element comprises a cam follower.

4. The device of claim 1, wherein the first axial cam element rotates around the axis relative to the second axial cam element.

5. The device of claim 1, wherein the spring is positioned on the hollow shaft between the first end and the second end of the hollow shaft.

6. The device of claim 5, wherein the spring is a compression spring that can rotate around the axis.

7. The device of claim 5, wherein the spring is compressed by movement of the arm toward the base irrespective of a starting position of the arm relative to the base.

8. The device of claim 7, wherein the movement of the arm toward the base causes the first and second opposing axial cam elements to move away from one another along the hollow shaft thereby compressing the spring to create a linear torque on the arm through a range of rotation of the arm relative to the base.

9. The device of claim 7, wherein the movement of the arm toward the base causes the first and second opposing axial cam elements to move away from one another along the hollow shaft thereby compressing the spring to create a non-linear torque on the arm through a range of rotation of the arm relative to the base.

10. The device of claim 1, wherein the conductor passes through the first and second opposing axial cam elements.

11. The device of claim 1, wherein movement of the arm away from the base causes the first and second opposing axial cam elements to move toward one another along the hollow shaft thereby releasing compression of the spring.

12. The device of claim 1, wherein the first cam surface comprises a first linear region that has a first slope and a second linear region that has a second slope that is different from the first slope.

13. The device of claim 12, wherein the movement of the arm toward the base causes the first axial cam element and the second axial cam element to move away from each other along the hollow shaft based on the first slope and then based on the second slope.

14. A device, comprising:
   a display coupled to a first end of an arm, the display having a mass;
   a base rotatably secured to a hollow shaft that is fixed to a second end of the arm, the hollow shaft defining opposing ends and defining an axis of rotation of the arm relative to the base;
   first and second axial cam elements positioned on the hollow shaft and a spring positioned on the hollow shaft between the opposing ends, the hollow shaft including a key that is parallel to the axis, the second axial cam element including a keyway that corresponds to the key of the hollow shaft, the key and the keyway allowing the second axial cam element to move along the hollow shaft in parallel to the axis but preventing the second axial cam element from rotating with respect to the hollow shaft around the axis, the first axial cam element comprising a first cam surface that forms an acute angle relative to the hollow shaft and the second axial cam element comprising an opposing second cam surface such that rotation of the arm toward the base causes engagement of the first cam surface against the second cam surface that forces the first and second axial cam elements apart and thereby compresses the spring and increases force during the rotation, the mass of the display imparting a first torque that forces the first and second axial cam elements apart and compresses the spring, the spring being configured to produce a second torque that counter-balances the first torque and creates a weightless feel for the display; and, a conductor extending from the base through the opposing ends of the hollow shaft and through the spring, into the arm, and from the arm to the display.

15. The device of claim 14, wherein one of the first and second axial cam elements rotates with the hollow shaft and the other of the first and second axial cam elements is fixed to the base.

16. The device of claim 14, wherein the first cam surface has a plurality of regions of different slopes, and the rotation of the arm toward the base forces the first axial cam element and the second axial cam element apart based on the different slopes.

17. A device, comprising:
a base mount and an arm attached to a display having a mass; and,
a hinge assembly rotatably coupling the base mount and the arm, the hinge assembly comprising:
a shaft defining opposing ends and defining an axis of rotation of the arm relative to the base mount, the shaft having first and second cam elements positioned thereon between the opposing ends, the shaft including a key that is parallel to the axis, the second cam element including a keyway that corresponds to the key of the shaft, the key and the keyway allowing the second cam element to move along the shaft in parallel to the axis but preventing the second cam element from rotating with respect to the shaft around the axis, the first cam element defining a first cam surface that defines an acute angle relative to the shaft and that engages a complementary angled second cam surface defined by the second cam element; and, a spring positioned on the shaft and biasing the first and second cam elements toward one another, wherein for any starting position of the arm relative to the base mount, rotation of the arm toward the base mount causes engagement of the first cam surface and the second cam surface of the cam elements to compress the spring which increases a first torque to counter further rotation of the arm toward the base mount, the mass of the display imparting a second torque that forces the first and second cam elements away from each other and compresses the spring, the spring being configured to produce a third torque that counter-balances the second torque and creates a weightless feel for the display.

18. The device of claim 17, wherein the shaft is a hollow shaft and a conductor extends from the base mount through the hollow shaft via the opposing ends of the shaft into the arm.

19. The device of claim 18, wherein the conductor is connected to the display.

20. The device of claim 17, wherein the second torque and the third torque are opposite and equivalent or wherein the second torque and the third torque are opposite and not equivalent.

21. The device of claim 17, wherein the first cam surface defines multiple slopes, and the mass of the display imparts the second torque that forces the first cam element and the second cam element away from each other based on the multiple slopes.

* * * * *